United States Patent [19]

Iranmanesh

[11] Patent Number: 5,234,847
[45] Date of Patent: Aug. 10, 1993

[54] METHOD OF FABRICATING A BICMOS DEVICE HAVING CLOSELY SPACED CONTACTS

[75] Inventor: Ali A. Iranmanesh, Federal Way, Wash.

[73] Assignee: National Semiconductor Corporation, Santa Clara, Calif.

[21] Appl. No.: 789,389

[22] Filed: Nov. 6, 1991

Related U.S. Application Data

[63] Continuation of Ser. No. 502,902, Apr. 2, 1990, abandoned.

[51] Int. Cl.$^5$ .......................................... H01L 21/265
[52] U.S. Cl. .......................................... 437/34; 437/59; 437/231; 437/31; 148/DIG. 9
[58] Field of Search .................. 437/34, 41, 40, 59, 437/913

[56] References Cited

U.S. PATENT DOCUMENTS

| | | |
|---|---|---|
| 3,955,269 | 5/1976 | Magdo et al. |
| 4,484,388 | 11/1984 | Iwasaki |
| 4,507,847 | 4/1985 | Sullivan |
| 4,536,945 | 8/1985 | Gray et al. |
| 4,609,568 | 9/1986 | Koh et al. |
| 4,707,456 | 11/1987 | Thomas et al. ............ 357/43 |
| 4,735,916 | 4/1988 | Homma et al. ............ 437/57 |
| 4,764,480 | 8/1988 | Vora |
| 4,778,774 | 10/1988 | Blossfeld ............ 148/DIG. 11 |
| 4,784,971 | 11/1988 | Chiu et al. ............ 357/43 |
| 4,795,722 | 1/1989 | Welch et al. |
| 4,829,025 | 5/1989 | Iranmanesh |
| 4,897,364 | 1/1990 | Nguyen |
| 4,902,640 | 2/1990 | Sachitano et al. ............ 437/193 |
| 4,925,807 | 5/1990 | Yoshikawa ............ 437/200 |
| 4,948,745 | 8/1990 | Pfiester et al. ............ 437/56 |
| 4,960,726 | 10/1990 | Lechaton et al. ............ 437/31 |
| 4,966,865 | 10/1990 | Welch et al. ............ 437/31 |
| 4,992,388 | 2/1991 | Pfiester ............ 437/40 |
| 5,001,081 | 3/1991 | Tuntasood et al. ............ 437/31 |
| 5,015,594 | 5/1991 | Chu et al. ............ 437/34 |

FOREIGN PATENT DOCUMENTS

0252206 1/1988 European Pat. Off.
0263756 4/1988 European Pat. Off.

OTHER PUBLICATIONS

Silicon Processing for the VLSI Era; Wolf et al. vol. 1; 1986; pp. 529–531.
Inside Technology, Is BiCMOS the next technology driver; Electronics, Feb. 88; pp. 55–67.
Chiu, Tzu-Yin, "A High Speed Super Self-Aligned Bipolar-CMOS Technology", Int'l Electron Devices Meeting, Dec. 1987.
Brassington, et al., "An Advanced Single-Level Polysilicon Submicrometer BiCMOS Technology," IEEE Trans. Elect. Devices, pp. 712–719 1989.
Momose, et al., "1μm n-well CMOS/Bipolar Technology," IEDM Transactions (Feb. 1985) p. 217.
Kapoor, et al., "A High Speed High Density Single-Poly ECL Technology for Linear/Digital Applications" 1985 Custom Integrated Circuits Conference, pp. 184–187.
Gomi, et al., "A Sub-30psec Si Bipolar LSI Technology" IEDM Technical Digest (1988) pp. 744–747.
Takemura, et al., "BSA Technology for Sub-100mn Deep Base Bipolar Transistors" IEDM Technical Digest (1987), pp. 375–377.
Chiu, et al., "A Bird's Beak Free Local Oxidation Technology Feasible to VSLI Circuits Fabrication" IEEE Transactions on Electron Devices, vol. ED-29, No. 4, pp. 536–540, Apr., 1982.

Primary Examiner—Brian E. Hearn
Assistant Examiner—Michael Trinh
Attorney, Agent, or Firm—Townsend and Townsend

[57] ABSTRACT

A BiCMOS method and device. The BiCMOS device achieves improved performance through the use of silicide contacts overlying doped polysilicon which extend fully up to and contact sidewall oxide formations. Silicide contacts in emitter regions and gate regions are separated from silicide contacts of base contacts and source and drain contacts only by the thickness of the sidewall oxides, which are adjacent the emitter region and gate regions.

5 Claims, 9 Drawing Sheets

METHOD OF FABRICATING A BICMOS DEVICE HAVING CLOSELY SPACED CONTACTS

This is a continuation of application Ser. No. 07/502,902, filed Apr. 2, 1990, now abandoned.

BACKGROUND OF THE INVENTION

The present invention relates to the field of semiconductor devices and their manufacture. More specifically, in one embodiment the invention provides both bipolar and complementary metal-oxide (CMOS) semiconductor devices on a single substrate and a process for their fabrication.

Bipolar and CMOS devices and their fabrication have been well known for many years. Recently, the advantages of both types of devices have been beneficially incorporated into circuits using both types of devices on a single substrate. Circuits which incorporate both bipolar and CMOS devices have come to be known as "BiCMOS." BiCMOS devices offer the advantages of the high packing density and low power consumption of CMOS devices, as well as the high speed of bipolar devices. One BiCMOS device and process for fabrication thereof is described in U.S. Pat. No. 4,764,480 (Vora), assigned to the assignee of the present invention.

While meeting with some success, BiCMOS devices continue to have certain limitations. For example, electrical contacts in BiCMOS devices have caused limitations in their use. One limitation is the current drive capability of CMOS devices which is typically limited by source/drain sheet resistance. Extrinsic base resistance in bipolar transistors is in some instances an important factor in AC performance of bipolar structures. Still further, collector-substrate junction capacitance degrades the speed of bipolar circuits. High resistivity of a polysilicon-silicon substrate contact can limit the performance of especially small devices (e.g., submicron). Further, source and drain contacts in previous devices were spaced an undesirable distance from the gate of MOS transistors. Also, ground tap resistance may be a limiting factor in removal of injected current from the substrate in vertical fuse devices.

From the above it is seen that an improved BiCMOS device and method of fabrication thereof is desired not only to provide devices with improved performance and reduced size, but also to provide devices which can be fabricated more quickly and economically.

SUMMARY OF THE INVENTION

An improved BiCMOS device and method of fabrication thereof is disclosed. The invention provides devices which have improved performance, reduced size, and/or which may be fabricated more quickly and economically. The invention provides for source and drain contacts in MOS or CMOS devices extending fully up to gate sidewalls, so that only the gate sidewall thickness separates the source and drain contacts from the gate contact. In some embodiments, the invention further provides for base contacts which extend fully up to the emitter sidewall oxide. In a preferred embodiment the process enables the formation of about 0.8 μm or smaller design rule CMOS and bipolar transistors. The devices disclosed herein may be used with, for example, high performance Emitter Coupled Logic (ECL) standard cell designs, memory cells, gate array designs with embedded memory, and the like.

In one embodiment the invention comprises forming an active region in a substrate, and forming a first polysilicon region on the substrate over a portion of the substrate where the active region is located. First and second oxide spacers are formed on the sidewalls of the first polysilicon region. A second polysilicon layer is formed which extends fully up to the oxide spacers and is formed on the substrate in the area of the active region. A refractory metal coating is placed on the upper surface of the first and second polysilicon layers, with the coating on the second polysilicon layer extending up to the spacers. The metal is reacted with the adjacent polysilicon to produce a layer of metal silicide, which covers at least a portion of the upper surface of the first polysilicon region and at least a portion of the second polysilicon layer, and extends up to the first and second spacers.

A further understanding of the nature and advantages of the inventions herein may be realized by reference to the remaining portions of the specification and the attached drawings.

DESCRIPTION OF THE PREFERRED EMBODIMENTS CONTENTS

I. General
II. Fabrication Sequence of a BiCMOS Device

I. General

Figure 1:
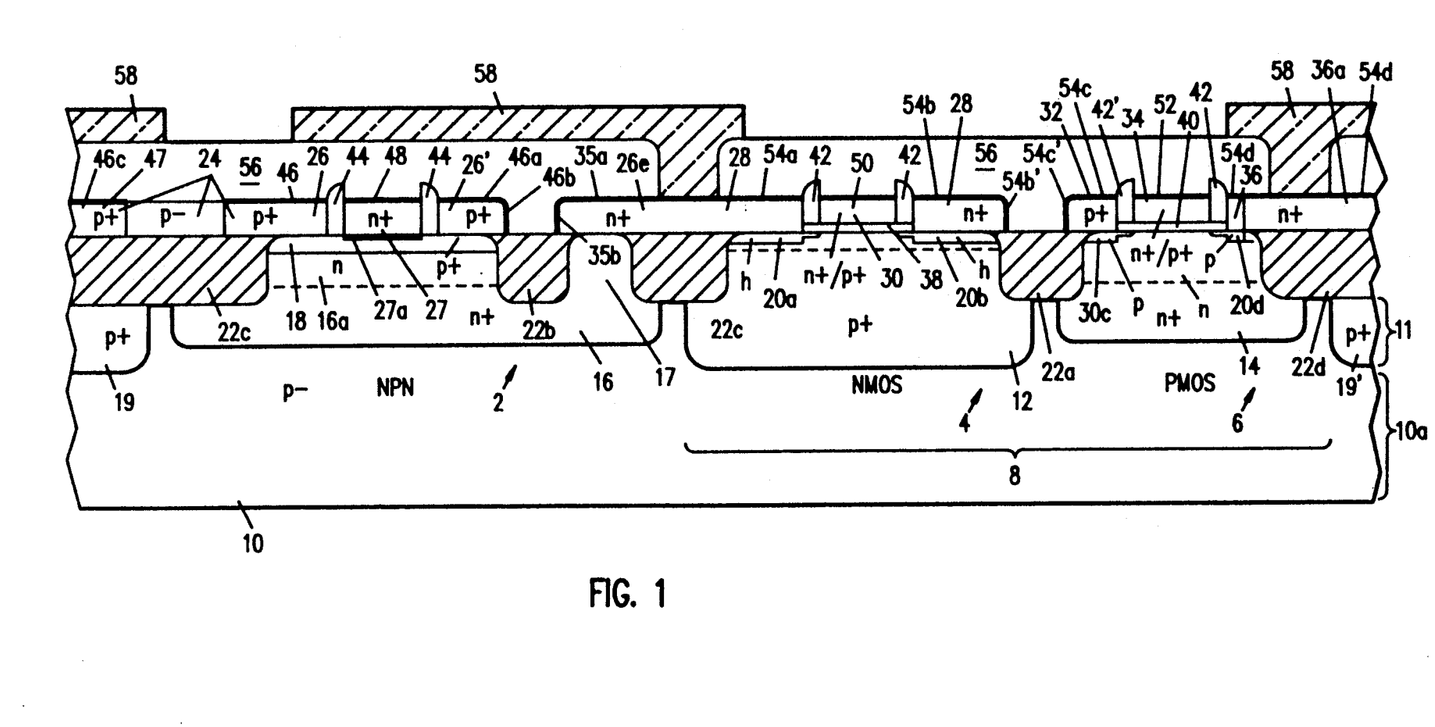
FIG. 1 is a cross-section of a BiCMOS structure according to one embodiment of the invention.

FIG. 1 illustrates a BiCMOS device in cross-section according to one embodiment of the invention. The device includes a bipolar transistor 2 (which in the embodiment shown in FIG. 1 is an NPN transistor), an n-channel MOSFET (NMOS transistor) 4 and a p-channel MOSFET (PMOS transistor) 6. The devices are fabricated on a substrate 10 which includes a single-crystal body 10a and an epitaxial layer 11. In the embodiment shown in FIG. 1 the single-crystal body is a p− conductivity body having a dopant concentration of between about $1 \times 10^{13}$ and $1 \times 10^{16}$ atoms per cubic centimeter. Using well known techniques a reduced pressure n-type epitaxial silicon layer 11 of desired thickness is grown on top of the single-crystal body. The devices are fabricated in the epitaxial layer 11 as described below.

In most embodiments the NMOS transistor 4 is formed in a p+ tub or well 12 and the PMOS transistor 6 is formed in an n+ tub or well 14. In preferred embodiments the n+ well 14 is doped to a concentration of between about $1 \times 10^{16}$ and $2 \times 10^{20}/cm^3$, and the p+ well 12 is doped to a concentration of between about $1 \times 10^{16}$ and $1 \times 10^{18}/cm^3$, although a wide range of dopant concentrations may be used without departing from the scope of the invention. Wells 12 and 14 enable the complementary conductivity devices to be formed on a single substrate.

The NPN transistor 2 is provided with a heavily doped buried layer 16 and collector sink 17, which together provide a low resistance connection region between a collector contact 20e and the collector 16a beneath a p-type base 18. In preferred embodiments the buried layer 16 and sink 17 are doped to a concentration of between about $1 \times 10^{17}$ and $1 \times 10^{20}$ with arsenic, antimony or the like, with a preferred range of about $5 \times 10^{18}$ to $1 \times 10^{20}/cm^3$. The collector 16a is a more lightly doped n-type formed between the base region 18 and the buried layer 16. An emitter region 27a is diffused from the emitter contact 27 into the underlying epitaxial layer 11.

The NMOS device 4 and PMOS device 6 include regions which are formed in the epitaxial silicon region 11. In the NMOS device 4, there are two self-aligned n type regions 20a, 20b that serve as the source and drain regions of the NMOS device. In the PMOS device 6, there are two self-aligned p type implanted regions 20c, 20d that serve as the source and drain regions of the PMOS device.

P+ channel stops 19, 19' are provided between the transistors and adjacent devices to prevent leakage which would short circuit the buried layer 16 or well 14 with adjacent devices. Between the NMOS transistor 4 and the PMOS transistor 6, between the sink 17 and the base 18, between the NPN and NMOS transistor, and between the transistors shown in FIG. 1 and adjacent transistors, oxide isolation regions 22a, 22b, 22c, 22d, and 22e, respectively, are provided for device isolation which typically will be SiO2. Viewed from the top of the structure, these oxide isolation regions connect to each other to form annular bands around the active device areas.

Along the surface of the device are polycrystalline silicon (polysilicon) regions forming a resistor 24, p+ base contact 26, a portion of which 26' also functions as an end contact portion of the resistor 24, emitter contact 27, n+ collector contact/NMOS drain contact 20e, NMOS source contact 28, NMOS gate 30, p+ source contact 32, PMOS gate 34, PMOS drain contact 36, and well tap 36a. The polysilicon regions are formed from two separately-deposited layers of polysilicon, as described below.

Thin gate oxide layers 38, 40 are provided beneath the NMOS and PMOS transistor gates, and sidewall oxide 42 is provided on the sides of the NMOS and PMOS gates. In preferred embodiments the NMOS gate is formed of heavily doped n+ polysilicon, while the PMOS gate is formed from n+ or p+ polysilicon, with n+ preferred because n+ will provide a buried channel device while p+ will provide a surface channel device. Sidewall oxide 44 is also provided on the sidewalls of the bipolar emitter 27. In the embodiment depicted in FIG. 1, the PMOS drain contact 36 is p+ doped and is adjacent to an n+ doped polysilicon region 36a which extends fully up to the PMOS drain contact 36.

Refractory metal silicide contacts 46a–46b are formed on the p+ bipolar transistor base contacts 26. Portions 46a, 46a' of the silicide contact cover the upper portion of the base contacts 26, 26' and extend up to and contact the sidewall oxide 44 of the emitter 27. A portion 46b also covers the sidewall of the base contact 26'. A separate silicide contact 48 is provided along the top portion of the emitter 27 between the sidewall spacer oxide regions 44. Thus, only the very narrow (typically less than about 0.2 microns) thickness of the sidewall oxide 44 separates the emitter contact 48 from the base contacts 46a.

Similarly, the collector contact 20e is covered on its upper surface with silicide 35a and on its sidewall with silicide 35b. The NMOS source contact 28 is covered on its upper surface with silicide 54b and on its sidewall with silicide 54b'. The NMOS gate 30 is covered on its upper surface with silicide 50 extending between the sidewall oxide 42. The p+ source contact 32 is covered on its upper surface with silicide 54c and on its sidewall surface with silicide 54c'. The PMOS gate 34 is covered on its upper surface with silicide 52 extending between the sidewall oxide 42. The p+ drain contact 36 and n+ well tap 36a are covered on their upper surface with silicide 54d.

Like the contact for the emitter 27, the silicide contacts 50 and 52 for the NMOS and PMOS gates, respectively, extend only from sidewall oxide to sidewall oxide. Conversely, the silicide contacts 54a, 54b, 54b', 54c, 54c', and 54d for the NMOS and PMOS transistor contacts extend up to and contact the sidewall oxide 42, 42' of the gates 30 and 34. The silicide contact 35b for the collector contact 20e covers the sidewalls of the contact down to field oxide region 22b, as well as the upper surface 35 of the collector 20e, with the collector contact upper surface silicide 35a being continuous with the NMOS contact silicide 54a. The refractory metal contacts shown herein reduce the resistivity of the adjacent polysilicon contacts and, therefore, increase the speed of the device.

The structure further includes a thick (about 0.8 to 1.3 and preferably about 1.3 μm) oxide layer 56 to insulate the devices from metal layer 58, used for interconnection purposes.

II. Fabrication Sequence of a BiCMOS Device

Figure 2A:
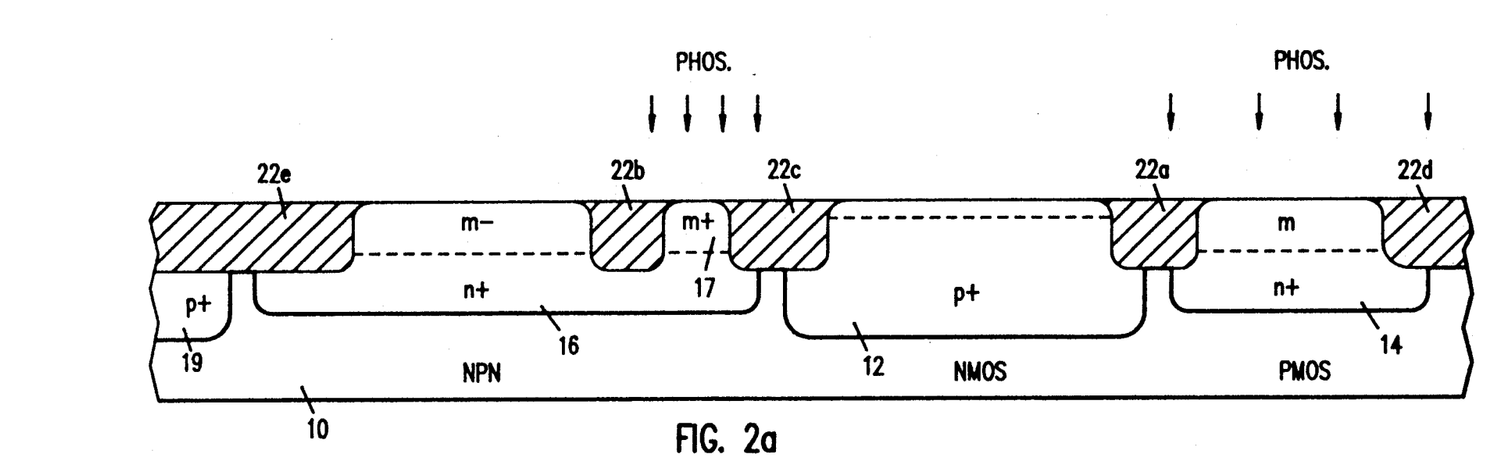
FIGS. 2a to 2p illustrate fabrication of a BiCMOS device.
Figure 2B:
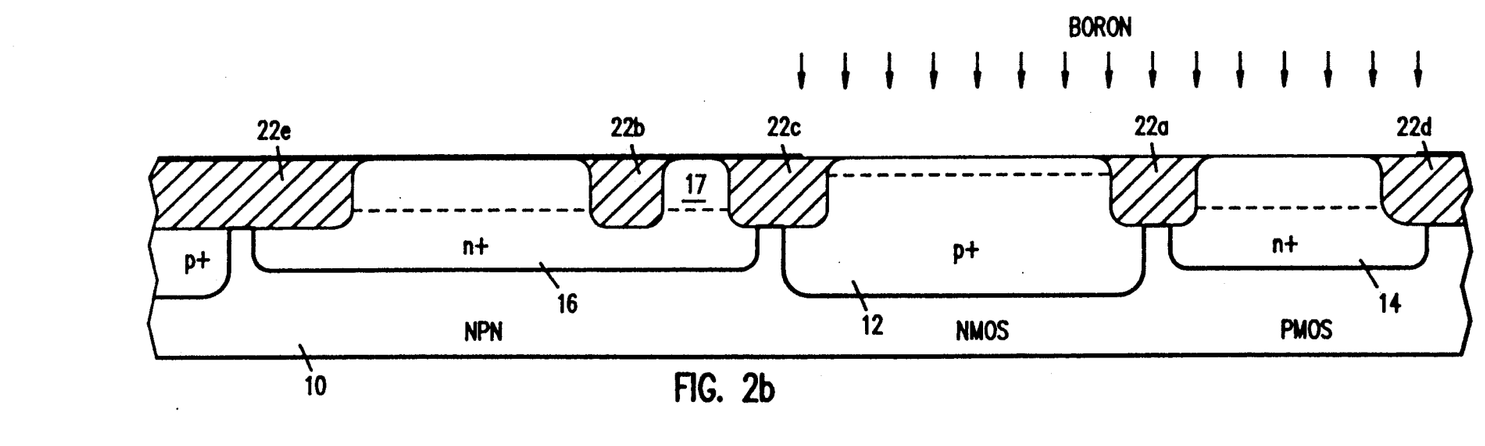
Figure 2C:
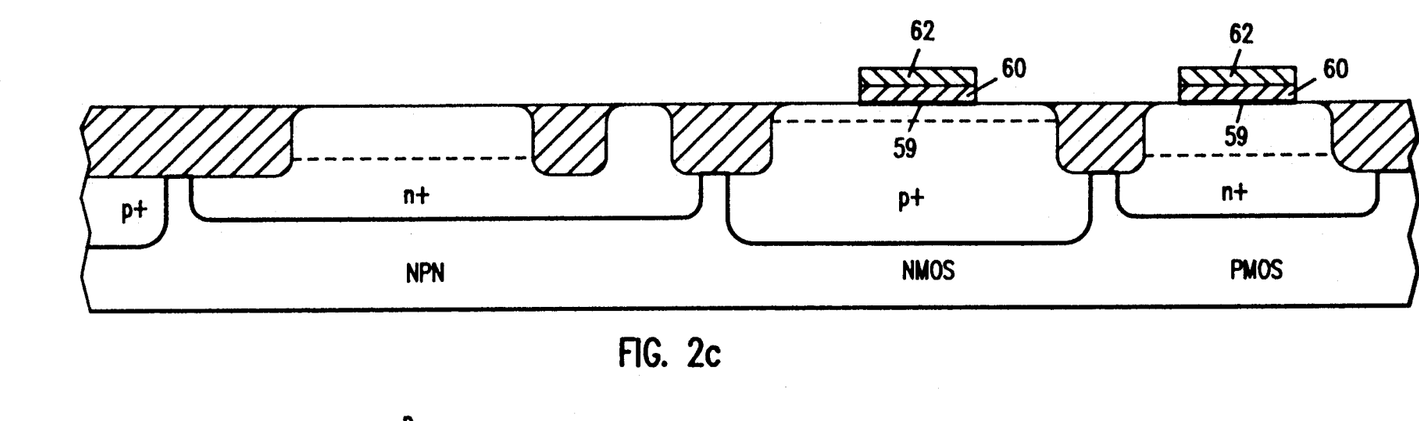
Figure 2D:
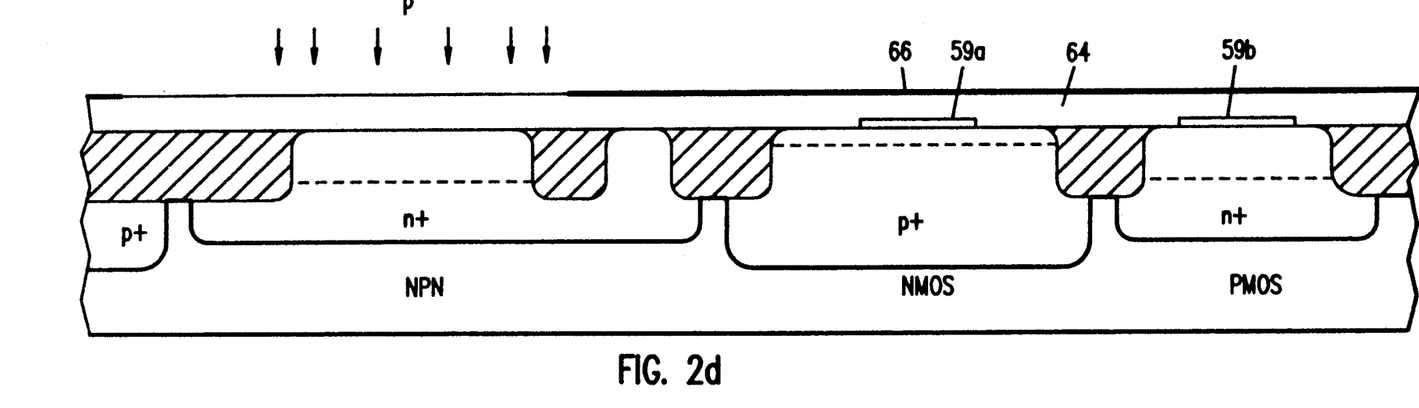
Figure 2E:
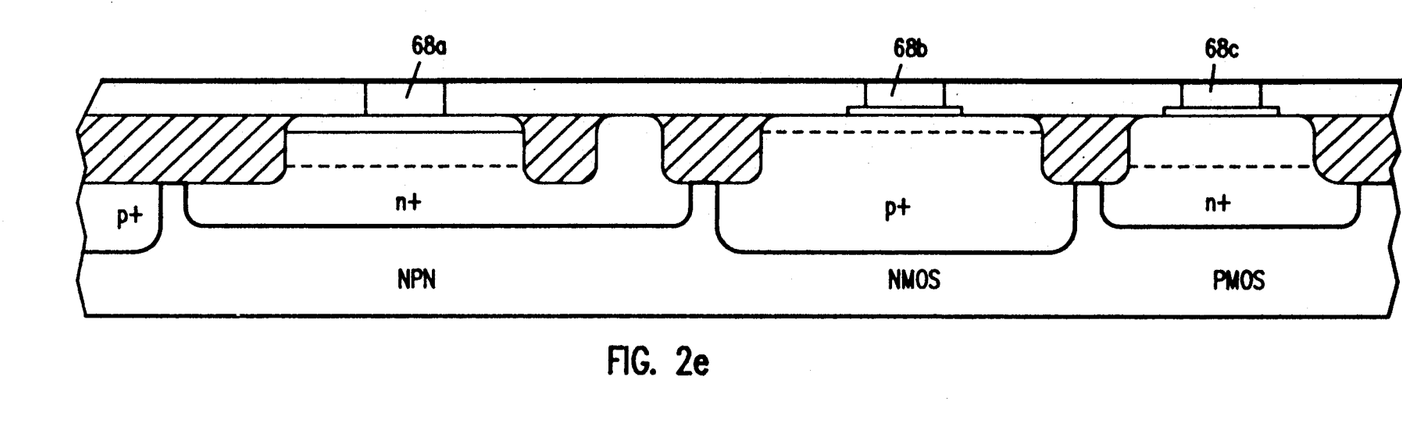
Figure 2F:
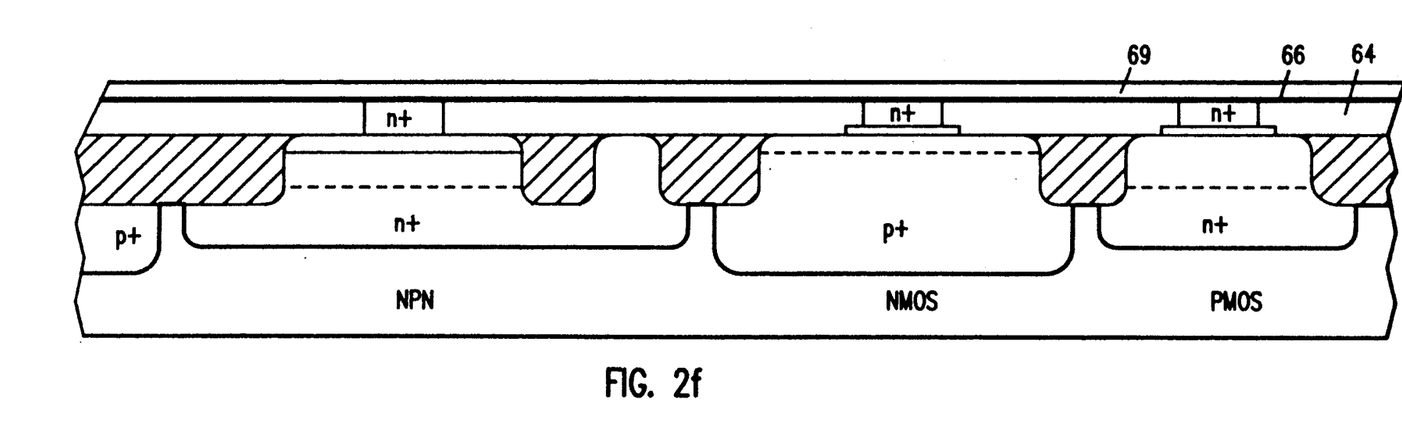
Figure 2G:
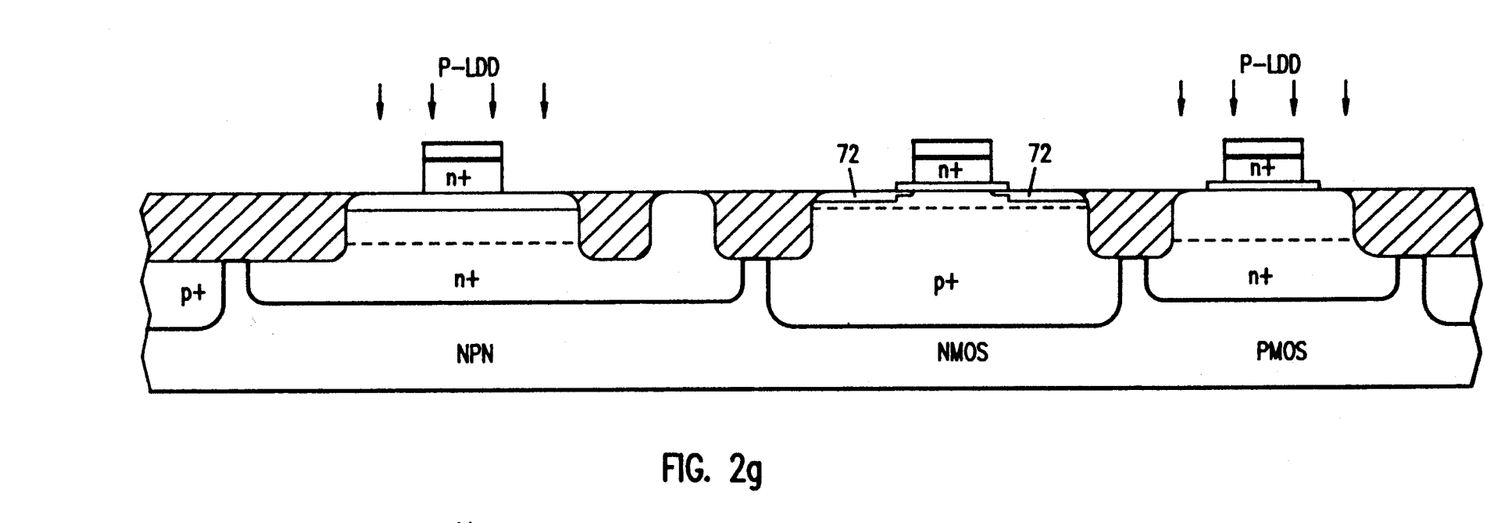
Figure 2H:
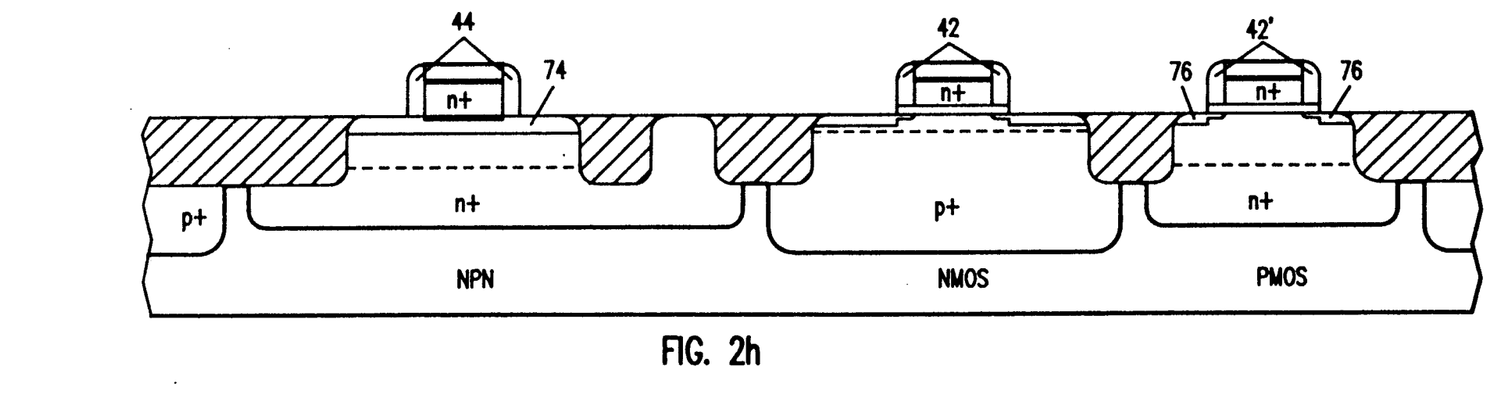
Figure 2I:
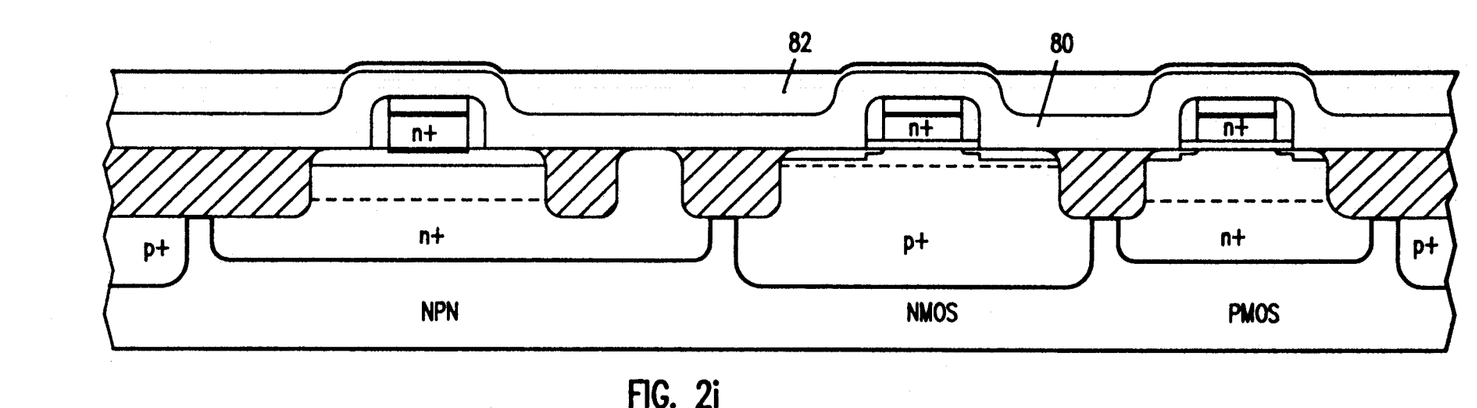
Figure 2J:
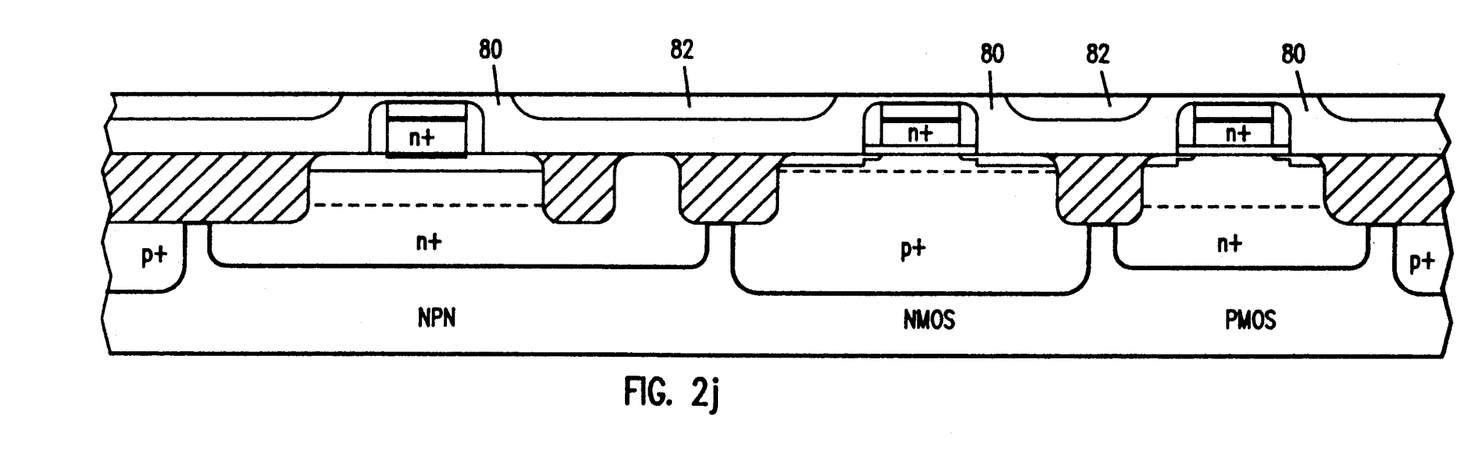
Figure 2K:
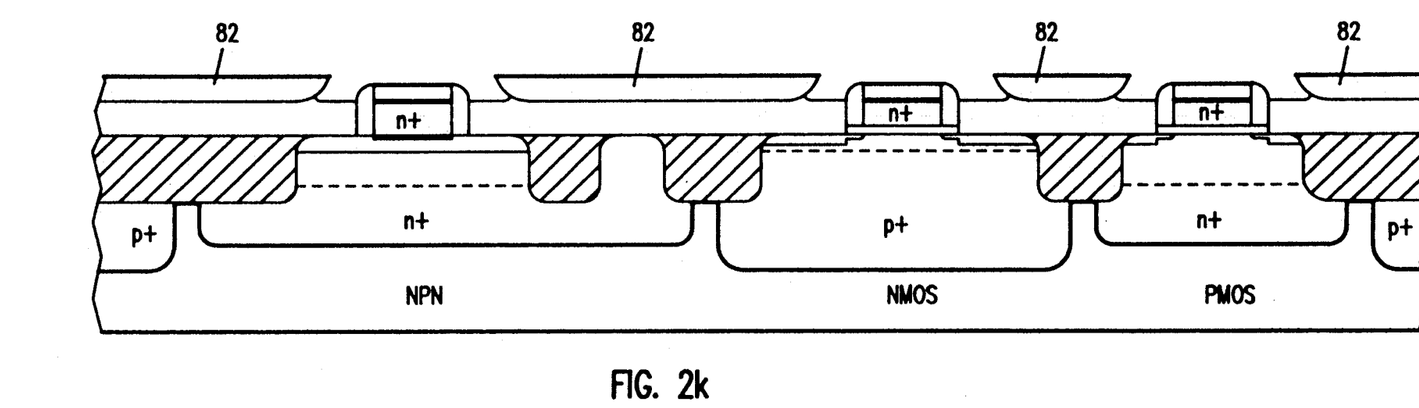
Figure 2L:
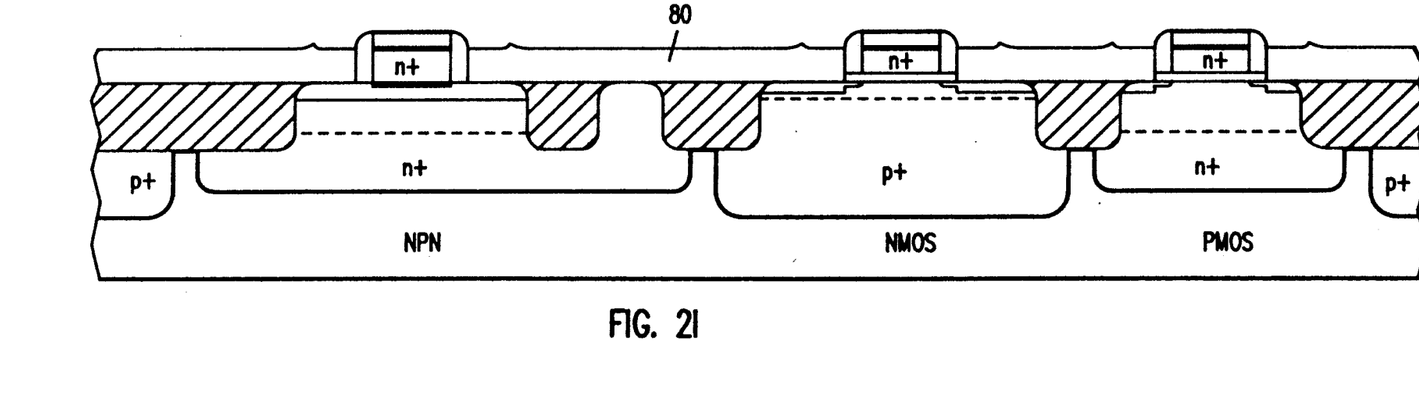
Figure 2M:
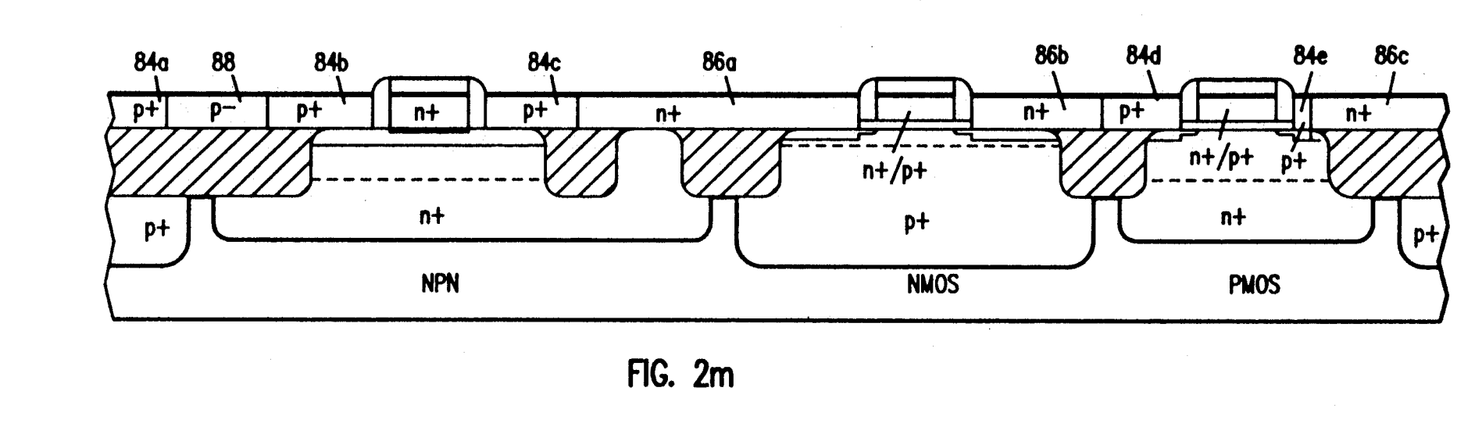
Figure 2N:
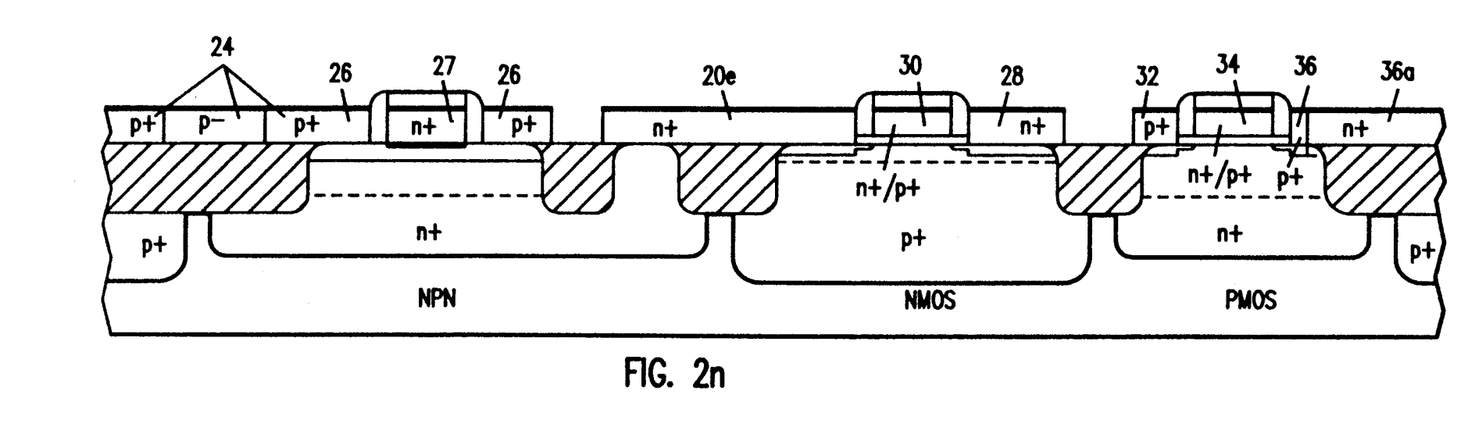
Figure 2O:
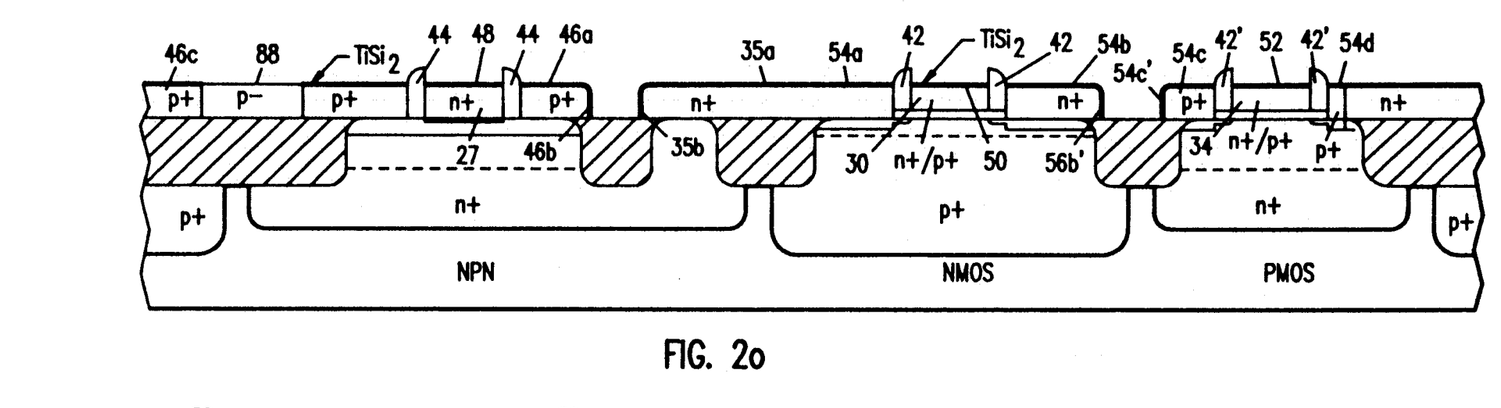
Figure 2P:
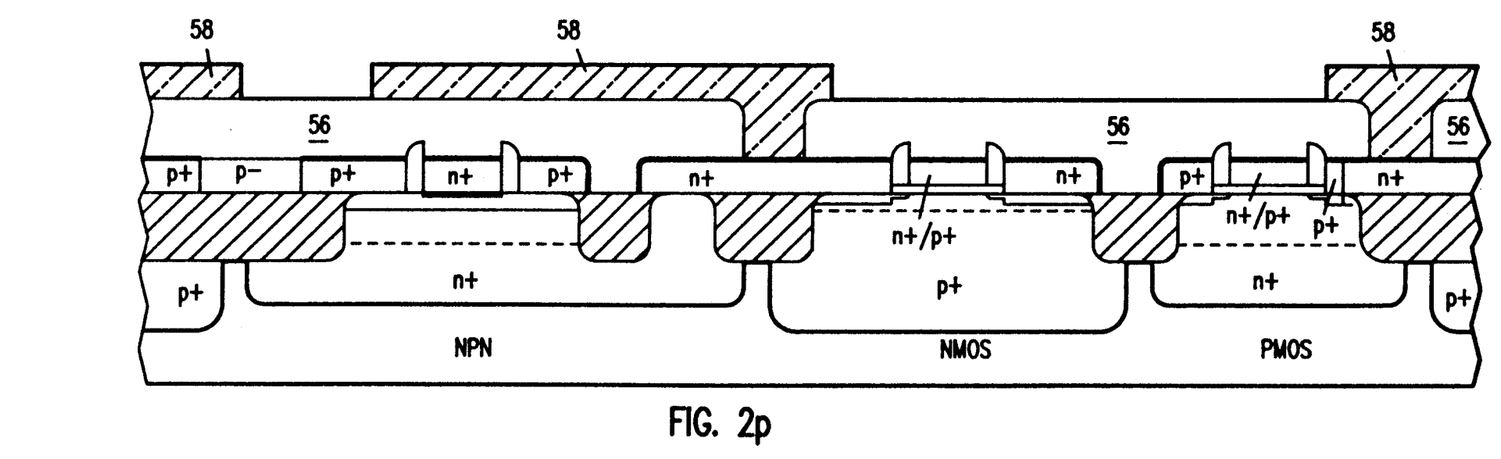

FIGS. 2a through 2p illustrate fabrication of the BiCMOS devices shown in FIG. 1. In particular, FIG. 2a illustrates a cross-section of the devices at a first stage of their fabrication. To reach this stage, the substrate 10 was masked for simultaneous formation of the n+ well 14 and the npn buried layer 16 with arsenic, antimony, or the like. The implant energy used for formation of regions 14 and 16 is preferably between about 50 and 200 KeV, with a preferred range of about 70 to 80 KeV such that the dopant concentration of regions 14 and 16 is between about $1 \times 10^{16}$ and $2 \times 10^{20}$, with a preferred range of between about $1 \times 10^{19}$ and $1 \times 10^{20}/cm^3$.

After formation of the n+ regions 14 and 16, the device is then masked for simultaneous formation of the p+ channel stop 19 and the NMOS well 12. The implant used in formation of the regions 19 and 12 is preferably between about 10 and 200 KeV with a preferred range of 50 to 150 KeV such that the dopant concentration of the p+ buried layers is between about $1 \times 10^{16}$ and $1 \times 10^{18}/cm^3$. The p+ regions preferably are doped with boron.

The buried layer/channel stop mask is then removed and an intrinsic n-type epitaxial layer having a thickness of about 1.1μ is grown across the surface of the device. A photoresist mask is then formed over the device so as to define field oxide regions 22a, 22b, 22c, and 22d. The oxide regions are formed using a modified Sidewall Masked Isolation ("SWAMI") process. The SWAMI process is described in, e.g., Chin, et al., *IEEE Transactions on Electron Devices*, Vol. ED-29, No. 4, April 1982, pp. 536–540, incorporated by reference. In some embodiments, the process is modified as described in copending application Ser. No. 07/502943, incorporated by reference. The substrate is then oxidized in a highly pressurized oxidation environment to grow the necessary field oxide.

Thereafter, a grown screen oxide layer having a thickness of about 250Å is formed on the surface of the device and a mask is formed, exposing only the sink region 17. A sink implant using an implant energy of between about 100 and 190 KeV with a dose of between about $1 \times 10^{14}$ and $1 \times 10^{16}$ is preferred using phosphorus as a dopant. The resulting dopant concentration in the sink region 17 is between about $1 \times 10^{19}$ and $1 \times 10^{20}/cm^3$. The sink mask is then removed and a separate mask/ion implantation is performed to dope the well and channel region of the PMOS transistor to a concentration of between about $1 \times 10^{16}$ and $1 \times 10^{17}$ using phosphorus as a dopant. In preferred embodiments the implant energy used for the PMOS channel region is between about 50 and 180 KeV. The resulting net dopant concentration in the channel region is between about and $1 \times 10^{16}$ and $1 \times 10^{20}$. The sink and n-well are then annealed and driven-in by heating with a conventional thermal cycle in nitrogen.

Thereafter, a mask is formed on the surface of the device which exposes only the NMOS and PMOS transistor regions. This mask is used for a threshold voltage implant as shown in FIG. 2b. The implant may be used to adjust the threshold voltage of the NMOS and PMOS transistors as necessary, typically to between about $|0.5|$ and $|1.0|$ volts. In preferred embodiments the threshold voltage implant is an implant of boron at a dose of between about $1 \times 10^{12}$ to $1 \times 10^{13}$ and on energy between 30 and 100 KeV, preferably about 50 KeV. The threshold voltage implant sets the threshold of the MOS transistors. The boron and the up-diffusing p+ from the buried layer will set the well profile for the NMOS transistor. The threshold voltage implant in conjunction with the n-well implant sets the threshold voltage for the PMOS transistor. In preferred embodiments the threshold voltage implant ultimately provides transistors with threshold voltages of about 0.7 to 0.9 volts for NMOS and $-0.8$ to $-1.0$ volts for PMOS.

The screen oxide then is stripped and a thin (on the order of 100 to 200Å, preferably 135-165Å) gate oxide layer 59 is grown using means well known to those of skill in the art. A thin (on the order of 100 to 1000Å, preferably 400-600Å) layer of polysilicon 60 is then deposited on the thin gate oxide layer and a mask 62 is formed on the poly layer to define the NMOS and PMOS gates. A plasma etch removes the undesired polysilicon from all regions of the device except those over the NMOS and PMOS gates to provide the configuration as shown in FIG. 2c. Next, a wet etch is used to remove the underlying oxide. The mask is then removed by conventional techniques. Protection of the gate oxide provides MOS gates 59a, 59b having fewer defects since they are not exposed directly to photoresist.

FIG. 2d illustrates the next sequence of process steps. Another layer of intrinsic polysilicon 64 having a thickness of about 1000 to 4000Å, preferably about 3200Å is deposited across the surface of the device and a cap oxide layer 66 is formed by thermal oxidation of the polysilicon layer 64. The devices are then masked with photoresist to expose at least the base region of the bipolar transistor and the lightly doped regions of the resistors. In some embodiments, only the NMOS and PMOS transistor regions are protected by the mask. A base implant is then performed and the base is annealed. In preferred embodiments the base implant uses an energy of between about 30 and 100 KeV, with an implant energy of between about 30 and 50 KeV and a dose of about $3 \times 10^{13}$ to $8 \times 10^{13}$ preferred. An anneal is performed by heating the structure to about 950° C. for about 45 minutes, and results in a p— base region having a thickness of between about 1000 and 2000Å with a dopant concentration of between about $1 \times 10^{18}$ and $1 \times 10^{19}/cm^3$, with a dopant concentration of about $5 \times 10^{18}/cm^3$ preferred.

Thereafter, as illustrated in FIG. 2e, a mask is formed which exposes regions 68a, 68b, and 68c which will eventually be used as the bipolar emitter contact, the NMOS gate, and the PMOS gate. The regions 68a, 68b, 68c are doped n+ using an arsenic implant with an energy of about 100 KeV to a concentration of between about $5 \times 10^{19}$ and $1 \times 10^{20}/cm^3$. As discussed above, the NMOS and PMOS gates may be either n+ or p+ and thus may be implanted using an n+ or a p+ mask. For purposes of the following description, the NMOS and PMOS gates will be described as being n+ doped.

In FIG. 2f, a layer of nitride 69 having a thickness of between about 1000 and 1200Å is deposited for the purpose of preventing undercutting of the underlying silicon. The polysilicon layer 64 is then annealed at 850° to 950° C. for a time of about 10 to 20 minutes.

Next, a mask is formed on the surface of the nitride to define the collector of the bipolar transistor and the gate of the NMOS and PMOS transistors. A dry etch with chlorine chemistry results in the structure shown in FIG. 2g. The mask is removed and a photoresist mask is formed to expose the source and drain region of the NMOS transistor. A lightly doped drain (LDD) implant is performed in which the source and the drain are lightly implanted with an n-type dopant such as phosphorous or arsenic and using an implant energy of between about 20 and 100 KeV with implant energies of between about 20 and 50 KeV preferred. This implant results in a net dopant concentration in the source and drain regions 72 of the NMOS transistor of between about $1 \times 10^{17}$ and $1 \times 10^{19}$. In a similar fashion, as illustrated in FIG. 2g, a p-type LDD using a dopant such as $BF_2$ or B+ is performed across the surface of the bipolar transistor and the PMOS transistor with only the source and drain of the PMOS transistor and the base region of the bipolar transistor exposed by a mask. As seen in FIG. 2h, a more heavily doped p-region 74 is formed in the base of the bipolar transistor and a more heavily doped p-region 76 is formed around the gate of the PMOS transistor, as seen in FIG. 2h. The resulting net dopant concentration in the regions 74 and 76 is between about $5 \times 10^{17}$ and $1 \times 10^{19}/cm^3$. The implant energy is preferably between about between about 10 and 60 KeV. When B+ is used as the dopant, the lower range of implant energy is used.

A Low Temperature Oxide (LTO) deposition is next performed. The oxide is then etched back using conventional means, leaving spacer oxide 48, 42, 42' on exposed sides of the gates and emitter.

As seen in FIG. 2i, a second layer of polysilicon 80 is deposited over the structure. The thickness of the layer 80 is preferably no greater than the thickness of the second polysilicon layer 64 (FIG. 2d), i.e., about 4000 angstroms or less. On top of the polysilicon layer 80, a planarizing layer 82 is deposited. The planarizing layer 82 can be any of a number of known planarizing materials, including, for example, spin photoresist. As shown in FIG. 2i, the planarizing layer is thinner over the raised emitters and gates and relatively thicker in other regions. The polysilicon layer 80 and planarizing layer 82 are dry-etched to produce the configuration depicted in FIG. 2j in which polysilicon is exposed around the emitter and gates, but remains covered in other areas. A region of polysilicon will also be exposed in the area surrounding the emitters and gates. The exposed polysilicon 80 is wet-etched to remove some polysilicon in the exposed region so as to expose the oxide sidewalls, to produce the structure depicted in FIG. 2k. The planarizing layers 82 are then removed to produce the structure depicted in FIG. 2l. In an alternative embodiment, the planarizing layer 82 is removed from the structure depicted in FIG. 2j prior to the wet-etch of the polysilicon.

A mask is formed which exposes regions 84a, 84b, 84c, 84d, and 84e (FIG. 2m). The regions are then doped p+ to a concentration of between about $1 \times 10^{17}$ and $1 \times 10^{20}$, with a dopant concentration of about $1 \times 10^{19}$, preferably using boron. The p+ mask is removed and another mask is formed on the surface of the device to expose regions 86a, 86b, and 86c (FIG. 2m). The regions 86 are doped n+, using an implant energy of about 100 KeV to a concentration of between about $1 \times 10^{18}$ and $1 \times 10^{20}$, with a dopant concentration of between about $1 \times 10^{19}$ and $1 \times 10^{20}/cm^3$, preferably using arsenic. Additional masking and implants can be performed to produce, for example, p-region 88 for forming poly-resistors. Although the described process includes forming the p+ doped regions prior to forming the n+ doped regions, it is equally feasible to form the n+ doped regions prior to the p+ doped regions. Following formation of the doped regions, the polysilicon is annealed by heating to about 850° to 950° C. for about 10 to 20 minutes.

Another mask is then formed over the device for the protection of the desired doped polysilicon regions, and the device is etched with chlorine or bromine chemistry to pattern the polysilicon, producing the configuration depicted in FIG. 2n.

Next, a layer of screen oxide is formed on the surface of the device over regions where it is desired not to form silicide, such as on the resistors. A layer of refractory metals, such as titanium, molybdenum, tantalum, tungsten, or the like, is then deposited across the surface of the device. Using means well known to those skilled in the art, the layer is heated to about 750° C. for about 10 seconds, preferably using a rapid thermal anneal (RTA), as needed to form an initial amount of silicide that will adhere to the adjacent layers of polysilicon. In this reaction, the refractory metal does not react with $SiO_2$. Unreacted metal, principally metal in contact with any oxide, is removed, for example, using $H_2O_2$ or $NH_3OH$. The device is again heated to cause a second silicide reaction to occur, completing the reaction between the refractory metal and adjacent polysilicon and epitaxial silicon. The reaction is preferably conducted in two steps, as described, because reaction of a refractory metal in a single step or pulse may cause undesirable reaction of the refractory metal with the sidewall oxide layers. The resulting structure is depicted in FIG. 2o. As shown in FIG. 2o, the silicide layer 46a extends up to and contacts the sidewall oxide 44 in the bipolar device. Similarly, the silicide layers 54a, 54b, 54c, 54d extend up to and contact the sidewall layers 42, 42' of the MOS devices.

As shown in FIG. 2p, an oxide layer 56 is deposited and masked, as is well known in the art, to form contact holes therein. Metal 58 is deposited on the surface of the device, masked, and etched from selected regions, providing the device shown in FIG. 1.

It is to be understood that the above description is intended to be illustrative and not restrictive. Many variations of the invention will become apparent to those skilled in the art upon review of this disclosure. Merely by way of example, particular regions of the device shown herein have been illustrated as being p-type or n-type, but it will be apparent to those skilled in the art that the role of n- and p-type dopants may readily be reversed. Further, while the invention has been illustrated with respect to specific dopant concentrations in some instances, it should also be clear that a wide range of dopant concentrations may be used for many features of the devices herein without departing from the scope of the invention. Still further, while the invention herein has been illustrated primarily in relation to the BiCMOS device, many facets of the invention could be applied in the fabrication of bipolar transistors, MOSFETs, or other devices in isolation or combination. The scope of the invention should, therefore, be determined not with reference to the above description but, instead, should be determined with reference to the appended claims along with their full scope of equivalents.

What is claimed is:

1. A method for forming a transistor device, comprising:

providing a silicon substrate;

forming at least a first buried doped layer in said substrate;

forming a first polysilicon layer on the surface of said substrate;

removing selected portions of said first polysilicon layer to pattern said layer so as to provide a first polysilicon region on said substrate in the area above said first buried layer, said first polysilicon region having a upper surface and first and second sidewall surfaces;

doping said first polysilicon region;

annealing said substrate;

implanting portions of said substrate to form source and drain regions for a field effect device;

depositing spacer oxide over substantially the entire surface of said substrate and said first polysilicon region;

dry-etching said oxide to remove selected portions of said oxide, leaving layers of oxide adjacent said first and second sidewalls of said first polysilicon regions;

depositing a second polysilicon layer over substantially the entire surface of said substrate and said first polysilicon region following said step of implanting;

depositing a planarizing layer;

dry-etching the upper surface of said deposited polysilicon and said planarizing layers;

wet-etching the upper surface of said deposited polysilicon layer to provide said second polysilicon layer extending to said first and second spacers wherein said second polysilicon layer is separated from said first polysilicon region only by said first and second spacers;

masking and etching said second polysilicon layer to remove selected portions thereof for providing desired patterning following said step of depositing a planarizing layer;

forming a coating, said coating extending over both said upper surface of said first polysilicon region and at least a portion of the upper surface of said second polysilicon layer, said coating comprising a refractory metal, said step of forming a coating being conducted after said step of masking and etching said second polysilicon layer and after said step of implanting;

reacting said metal with adjacent polysilicon to produce a layer of silicide covering at least a portion of said upper portion of said first polysilicon region and at least a portion of said second polysilicon layer and extending up to said first and second spacers; and removing unreacted portions of said refractory metal.

2. A method, as claimed in claim 1, further comprising doping said first polysilicon region to configure said first polysilicon region as a gate of a field effect transistor.

3. A method, as claimed in claim 1, further comprising implanting doping material in selected portions of said second polysilicon layer and annealing said implanted polysilicon.

4. A method, as claimed in claim 1, further comprising:

forming a layer of nitride over at least portions of said first polysilicon region.

5. A method, as claimed in claim 1, wherein said substrate includes an epitaxial layer.

* * * * *